United States Patent
Kimman et al.

(10) Patent No.: US 11,156,925 B2
(45) Date of Patent: Oct. 26, 2021

(54) POSITIONING SYSTEM FOR A LITHOGRAPHIC APPARATUS

(71) Applicants: ASML Netherlands B.V., Veldhoven (NL); Carl Zeiss SMT GmbH, Oberkochen (DE)

(72) Inventors: Maarten Hartger Kimman, Veldhoven (NL); Jasper Wesselingh, Möttingen (DE)

(73) Assignees: ASML Netherlands B.V., Veldhoven (NL); Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 16/976,326

(22) PCT Filed: Feb. 14, 2019

(86) PCT No.: PCT/EP2019/053613
§ 371 (c)(1),
(2) Date: Aug. 27, 2020

(87) PCT Pub. No.: WO2019/170379
PCT Pub. Date: Sep. 12, 2019

(65) Prior Publication Data
US 2021/0041793 A1 Feb. 11, 2021

(30) Foreign Application Priority Data
Mar. 9, 2018 (EP) .................. 18160934

(51) Int. Cl.
*G03F 7/20* (2006.01)
*H02K 41/035* (2006.01)
*H02K 11/21* (2016.01)

(52) U.S. Cl.
CPC ........ *G03F 7/70758* (2013.01); *G03F 7/7095* (2013.01); *G03F 7/70483* (2013.01);
(Continued)

(58) Field of Classification Search
CPC ............. G03F 7/70758; G03F 7/70483; G03F 7/70033; G03F 7/70691; G03F 7/707;
(Continued)

(56) References Cited

U.S. PATENT DOCUMENTS

| 4,439,699 A | 3/1984 | Brende et al. |
| 4,717,874 A * | 1/1988 | Ichikawa ......... B60G 17/01933 324/207.11 |

(Continued)

FOREIGN PATENT DOCUMENTS

| JP | S58-123361 A | 7/1983 |
| JP | S63-242160 A | 10/1988 |

(Continued)

OTHER PUBLICATIONS

International Search Report and Written Opinion of the International Searching Authority directed to related International Patent Application No. PCT/EP2019/053613, dated May 28, 2019; 10 pages.

International Preliminary Report on Patentability directed to related International Patent Application No. PCT/EP2019/053613, dated Sep. 15, 2020; 7 pages.

*Primary Examiner* — Christina A Riddle
(74) *Attorney, Agent, or Firm* — Sterne, Kessler, Goldstein & Fox P.L.L.C.

(57) ABSTRACT

A positioning system to position a structure comprises an actuator and a control unit to control the actuator in response to a position setpoint received by the control unit. The actuator comprises a magnet assembly comprises a magnet configured to provide a magnetic flux, and a coil assembly, wherein the coil assembly and the magnet assembly are movable relative to each other, the coil assembly comprising a coil, an actuation of the coil by a drive current providing for a force between the magnet assembly and the coil assembly. The magnet assembly comprises a further electric conductor, the further electric conductor comprising a non-
(Continued)

ferromagnetic electrically conductive material, wherein the further electric conductor is magnetically coupled to the coil of the coil assembly and forms a short circuit path for an inductive electrical current induced in the further electric conductor as a result of an actuator current in the coil.

18 Claims, 6 Drawing Sheets

(52) U.S. Cl.
CPC ......... *G03F 7/70825* (2013.01); *H02K 11/21* (2016.01); *H02K 41/0356* (2013.01); *G03F 7/70033* (2013.01)

(58) Field of Classification Search
CPC ............. G03F 7/70716; G03F 7/70725; G03F 7/70766; G03F 7/70775; G03F 7/708; G03F 7/70808; G03F 7/70816; G03F 7/70825; G03F 7/7085; G03F 7/70883; G03F 7/709; G03F 7/7095; H02K 11/21; H02K 41/03; H02K 41/0356; H02K 21/46; H02K 17/14; H02K 17/16; H02K 17/165; H02K 19/14; H02K 27/06; H01F 1/0018
USPC ...................... 355/39, 52–55, 67–77; 310/10, 310/12.01–12.06, 14, 12.16, 12.19, 310/12.24–12.26, 49.02, 72, 154.44, 210, 310/124, 125, 182, 197, 225
See application file for complete search history.

(56) References Cited

U.S. PATENT DOCUMENTS

| | | | |
|---|---|---|---|
| 5,420,468 A * | 5/1995 | Mody | G11B 21/083 |
| | | | 310/13 |
| 6,822,368 B2 | 11/2004 | Maslov et al. | |
| 7,456,935 B2 | 11/2008 | Cox et al. | |
| 2004/0239911 A1 | 12/2004 | Carter et al. | |
| 2006/0158046 A1* | 7/2006 | Barnes | G02B 7/1821 |
| | | | 310/12.25 |
| 2007/0205674 A1* | 9/2007 | Tseng | H02K 41/0356 |
| | | | 310/14 |
| 2009/0315414 A1 | 12/2009 | Shikayama et al. | |
| 2009/0315424 A1 | 12/2009 | Vollmer | |
| 2011/0267596 A1* | 11/2011 | Muehlberger | G02B 13/143 |
| | | | 355/67 |
| 2015/0252869 A1* | 9/2015 | Grand | B64D 45/00 |
| | | | 310/93 |
| 2017/0111002 A1* | 4/2017 | Hemati | H02J 50/10 |

FOREIGN PATENT DOCUMENTS

| | | |
|---|---|---|
| JP | H07-023554 A | 1/1995 |
| JP | 2004-096910 A | 3/2004 |
| JP | 2005-528878 A | 9/2005 |
| JP | 2009-124879 A | 6/2009 |
| JP | 2010-153908 A | 7/2010 |
| JP | 2014-155241 A | 8/2014 |
| WO | WO 2017/024409 A1 | 2/2017 |

* cited by examiner

POSITIONING SYSTEM FOR A LITHOGRAPHIC APPARATUS

CROSS-REFERENCE TO RELATED APPLICATIONS

This application claims priority of EP application 18160934.8 which was filed on Mar. 9, 2018 and which is incorporated herein in its entirety by reference.

FIELD OF THE INVENTION

The present invention relates to a positioning system, a lithographic apparatus comprising such positioning system, a projection system for a lithographic apparatus comprising such a positioning system, a stage apparatus for a lithographic apparatus comprising such a positioning system, an electron beam inspection apparatus comprising such a positioning system, and a method of positioning a structure.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, a lithographic apparatus comprises one or more positioning devices or positioning systems for positioning or displacing components or objects of the apparatus or inside the apparatus.

Such a positioning system may e.g. comprise an actuator such as an electromagnetic actuator which comprises a coil assembly and a magnet assembly. The coil assembly, when driven by a drive current, generates a magnetic field, the drive current interacts with a magnetic field provided by the magnet assembly, as may result in a force between the coil assembly and the magnet assembly. The magnet assembly and the coil assembly may be movable in respect of each other, allowing one of the magnet assembly and the coil assembly to move, when subjected to the force, in respect of the other one of the magnet assembly and the coil assembly.

Due to the inductive nature of the coil assembly, i.e. the inductive nature of a coil in the coil assembly, an impedance of the coil assembly tends to increase with increasing frequency. As a result, when attempting to use the actuator for high frequency actuation, the higher a frequency of driving the coil assembly, the higher a driving voltage will be required to provide the drive current.

Likewise, at such higher frequencies, a phase lag tends to occur in a motor constant, providing a delay in force as a function of current with increasing frequency.

As a result, an achievable bandwidth of actuation by the electromagnetic actuator is limited. Furthermore, high driving voltages as required may provide high motor driver (e.g. amplifier) dissipation.

SUMMARY OF THE INVENTION

It is desirable to provide a high bandwidth positioning system.

According to an aspect of the invention, there is provided a positioning system to position a structure, the positioning system comprising an actuator and a control unit to control the actuator in response to a position setpoint received by the control unit, the actuator comprising:
a magnet assembly comprises a magnet configured to provide a magnetic flux, and
a coil assembly, wherein the coil assembly and the magnet assembly are movable relative to each other, the coil assembly comprising a coil, an actuation of the coil by a drive current providing for a force between the magnet assembly and the coil assembly,
wherein the magnet assembly comprises a further electric conductor, the further electric conductor comprising a non-ferromagnetic electrically conductive material, wherein the further electric conductor is magnetically coupled to the coil of the coil assembly and forms a short circuit path for an inductive electrical current induced in the further electric conductor as a result of an actuator current in the coil.

According to an aspect of the invention, there is provided a lithographic apparatus comprising the positioning system according to the invention to position a structure of the lithographic apparatus.

According to an aspect of the invention, there is provided a projection system for a lithographic apparatus, the projection system comprising one or more optical elements, and the positioning system according to the invention for positioning one or more of the optical elements.

According to an aspect of the invention, there is provided a stage apparatus for a lithographic apparatus, the stage apparatus comprising an object table and the positioning system according to the invention for positioning the object table.

According to an aspect of the invention, there is provided an electron beam inspection apparatus comprising the positioning system according to the invention.

According to an aspect of the invention, there is provided a method of positioning a structure by a positioning system, the positioning system comprising an actuator and a control unit to control the actuator in response to a position setpoint received by the control unit, the actuator comprising:
a magnet assembly comprises a magnet configured to provide a magnetic flux, and
a coil assembly, wherein the coil assembly and the magnet assembly are movable relative to each other, the coil assembly comprising a coil, an actuation of the coil by a drive current providing for a force between the magnet assembly and the coil assembly,
wherein the magnet assembly comprises a further electric conductor, the further electric conductor comprising a non-ferromagnetic electrically conductive material, wherein the further electric conductor is magnetically coupled to the coil of the coil assembly and forms a short circuit path for an inductive electrical current induced in the further electric conductor as a result of an actuator current in the coil, the method comprising:

driving, by means of the control unit, an actuator current into the coil assembly, thereby inducing the inductive current in the further electric conductor, the inductive current being short circuited by the short circuit path.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
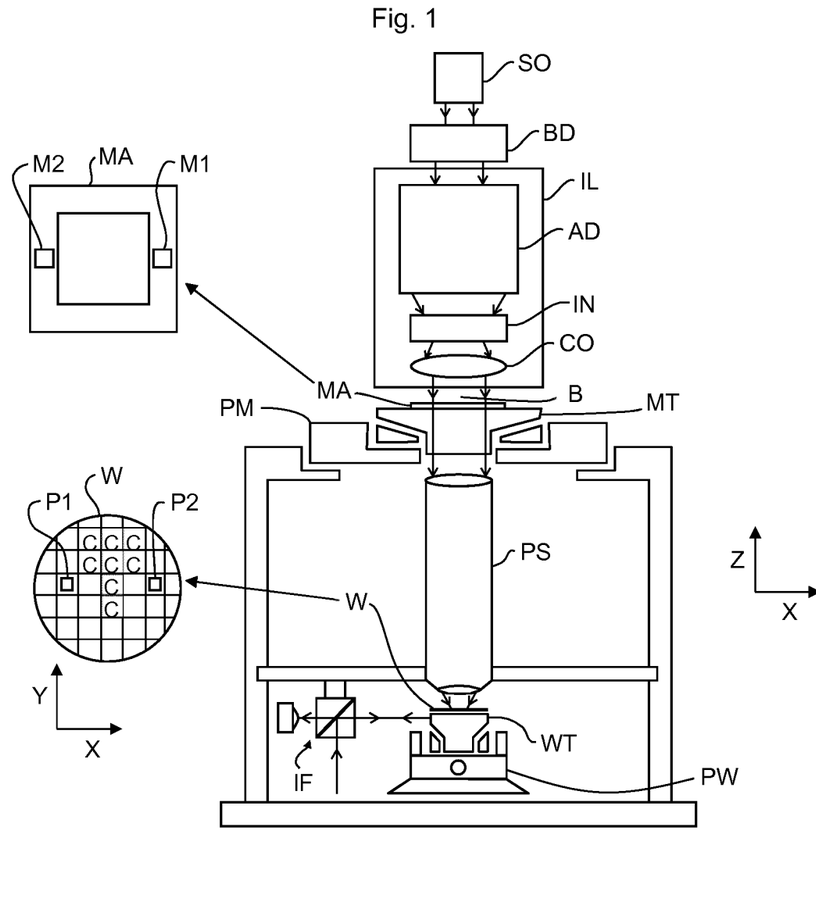
FIG. 1 depicts a lithographic apparatus in which embodiments of the invention may be employed.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
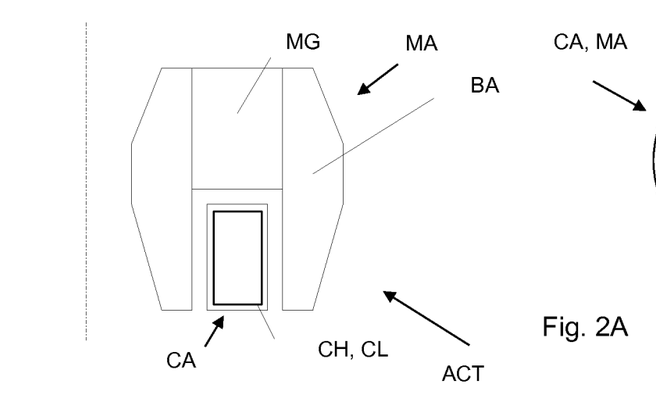
FIGS. 2A and 2B schematically depicts a cross sectional view and top view of a part of an actuator according to the prior art.
Figure 2B:
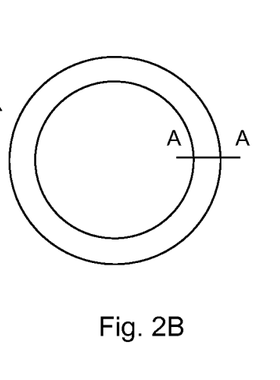
Figure 3:
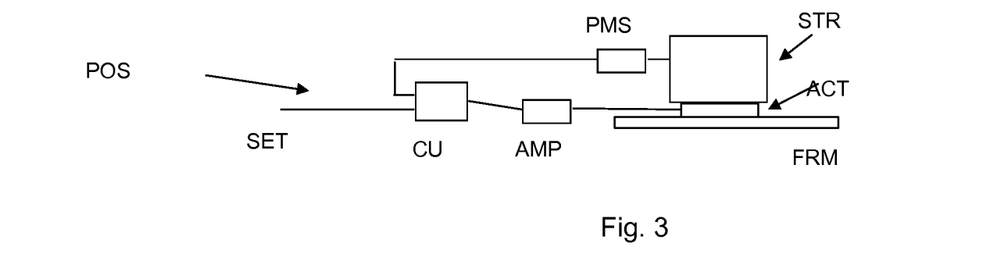
FIG. 3 schematically depicts a positioning system in which an actuator may be employed.

FIG. 2A depicts a cross sectional view of a part of an actuator ACT according to the prior art, the cross sectional view along the lines A-A of the top view of the actuator as depicted in FIG. 2B. The actuator comprises a coil assembly CA and a magnet assembly MA. The coil assembly and magnet assembly are movable in respect of each other. For example, the coil assembly may be movable, the magnet assembly may be movable, or both the coil assembly and the magnet assembly may be movable. As depicted in FIG. 3, a positioning system POS for positioning a structure STR comprises the actuator ACT and a control unit CU. The structure may be any object. The control unit comprises a setpoint input for receiving a setpoint SET, i.e. an analogue or digital position setpoint that defines a desired position of the structure. The control unit drives the actuator based on the setpoint. Thereto, an amplifier AMP may be provided that drives the actuator, i.e. drives the coil of the coil assembly, in response to an output signal provided by the control unit and input to the amplifier. The positioning system may further comprise a position sensing system PMS to measure a position of the structure and comprising one or more position sensors (interferometers, encoders, capacitive sensors or any other suitable position sensors), a position signal representing the position of the structure being provided by the position sensing system to the control unit in order to provide a feedback control loop.

The magnet assembly comprises a magnet MG, such as a permanent magnet. Alternatively, an electromagnet could be applied. Furthermore, the magnet assembly may comprise a back-iron BA. The back-iron conducts a magnetic flux as provided by the magnet towards the coil assembly so as to concentrate a magnetic flux at the coil assembly. The back-iron may comprise iron or any other suitable (ferromagnetic) material capable of conducting magnetic flux. The coil assembly comprises windings forming an electric coil CL provided in a coil housing CH. The coil housing may hold the coil, provide a packaging of windings of the coil, may comprise a metal (e.g. a non-ferromagnetic conductor) and may provide for heat sinking to conduct dissipated heat away from the coil windings.

The actuator may position any structure, i.e. any object. The structure may be connected to one of the magnet assemble and the coil assembly. The other one of the magnet assembly and the coil assembly may for example be connected to a reference frame, force frame, base frame, balance mass or other reference structure.

The positioning system comprising the actuator ACT as depicted in FIG. 2A may be circular symmetric. In other words, the cross sectional view as depicted in FIG. 2A may circularly repeat to form a ring shaped actuator as depicted in FIG. 2B. Thus, the coil, of which in FIG. 2A a part is shown, may be ring shaped (annular). Similarly, the magnet and the back-iron(s) may be ring shaped. Thus, the back-iron depicted at the left side in FIG. 2A may form an inner, annular back-iron and the back-iron depicted at the right side in FIG. 2A may form an outer, annular back-iron. Correspondingly, windings of the coil of the coil assembly may extend annularly.

Figure 7A:
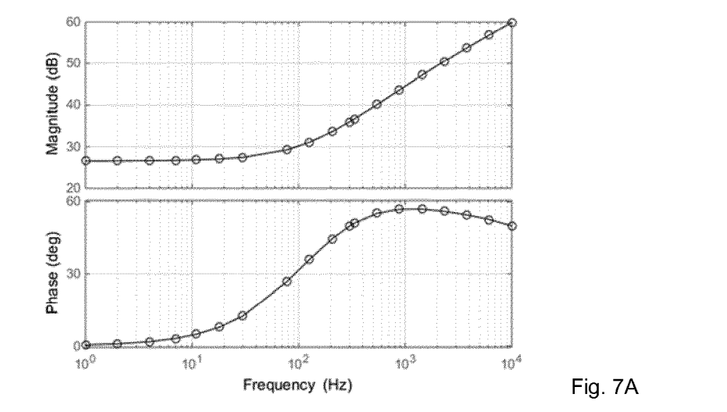
FIGS. 7A and 7B schematically depict bode diagrams of impedance response and motor constant of a prior art actuator.

FIG. 7A depicts a bode diagram of an impedance response of the actuator in accordance with FIG. 2A. At low frequency, the impedance of the coil is generally resistive as a result of a resistance of the coil windings. At higher frequencies, the impedance increases due to the inductive properties of the coil. As also shown in FIG. 7A, the phase of the impedance follows a similar behavior.

Figure 7B:
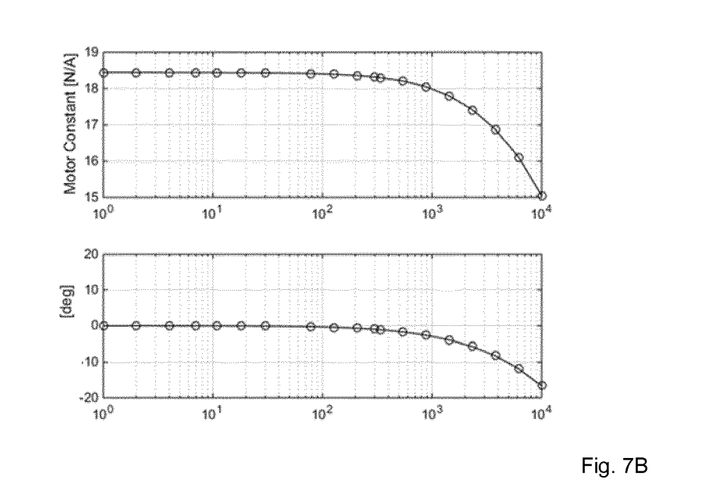

FIG. 7B depicts a bode diagram of a motor constant of the actuator in accordance with FIG. 2A. The motor constant is understood as an actuator force as a function of the coil drive current. At low frequency, the motor constant is substantially independent of frequency. At higher frequencies, the motor constant decreases. As also shown in FIG. 7B, the phase of the motor constant follows a similar behavior. The roll off in the motor constant provides for a delay in the response of the actuator, i.e. a delay in force as a function of drive current.

Figure 4A:
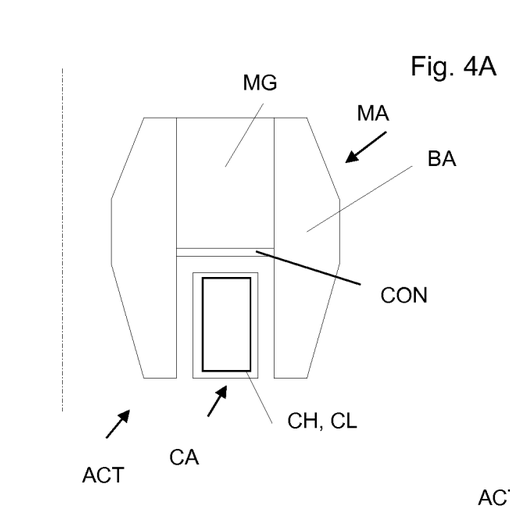
FIGS. 4A and 4B each schematically depict a part of an actuator as may be employed in a positioning system according to embodiments of the invention.

FIG. 4A depicts a cut out view of a part of an actuator as may be employed in a positioning system according to an embodiment of the invention. The actuator comprises a coil assembly and a magnet assembly generally as described above in relation to the actuator of FIG. 2A. Accordingly, reference is made to FIG. 2A and the corresponding description for the constituent parts and functions thereof. A general setup of a remainder of the positioning system as described with reference to FIG. 3. According to an aspect of the invention, the magnet assembly of the actuator further comprises a further electric conductor CON. The further electric conductor comprises a non-ferromagnetic electric conductor, preferably the further electric conductor being a non-ferromagnetic electric conductor, such as copper or aluminum. The further electric conductor is magnetically coupled to the coil of the coil assembly. Hence, an actuator current flowing in the coil of the coil assembly will induce, by the magnetic coupling, an inductive current in the further electric conductor. The current in the coil of the coil assembly will generate a coil magnetic field. By (changes in) the current in the coil and resulting (changes in) the coil magnetic field, a current will be induced in the further electric conductor. The further electric conductor provides for a short circuit path (e.g. a low electrical resistance path). Thus, the induced current is short circuited by the short circuit path. The term short circuit path is to be understood as a low resistance closed electrically conductive path. As the further electric conductor comprises a non-ferromagnetic material, magnetic permeability will substantially be unaltered by the presence of the further electric conductor hence, the magnetic field by the actuator current in the coil will be substantially unaltered by the presence of the further electric conductor. The further electric conductor may exhibit an electric conductivity that exceeds an electric conductivity of the magnet and/or the back iron to provide a low resistance, hence to effectively reduce the coil impedance as explained below. The coil when driven by a drive current, generates a coil magnetic field. As a result of the coil magnetic field, inductive currents will be induced in the further electric conductor. The inductive currents will, to some extent, provide for a, generally weaker, counter magnetic field that opposes the coil magnetic field to some extent. As a result of the inductive current, the coil magnetic field will be kept intact up to higher frequencies, providing for a reduction of the impedance of the actuator at higher frequencies. Illustrated in a different way: due to the magnetic coupling between the further electric conductor and the coil, and the low impedance electrical path in the further electric conductor, at higher frequencies, an effective impedance of the coil is reduced, in a similar way as a short circuited secondary winding of a transformer (compare: the low impedance path in the further electric conductor) would reduce an impedance of the primary winding of the transformer (compare the impedance of coil in the coil assembly). A dynamic performance of the positioning system may be improved and high frequency amplifier dissipation may be reduced. Furthermore, delay reduction may be provided as explained in more detail further below.

The further electric conductor may have any suitable shape. Preferably, the further electric conductor faces the coil assembly, i.e. is provided on a surface of the magnet and/or the back-iron which surface faces the coil assembly, so as to have the inductive currents at relative short distance of the coil assembly. The short circuit path formed by the further electric conductor may be coaxial with the windings of the coil, thus providing a good magnetic coupling hence an effective reduction in impedance at higher frequencies.

Figure 4B:
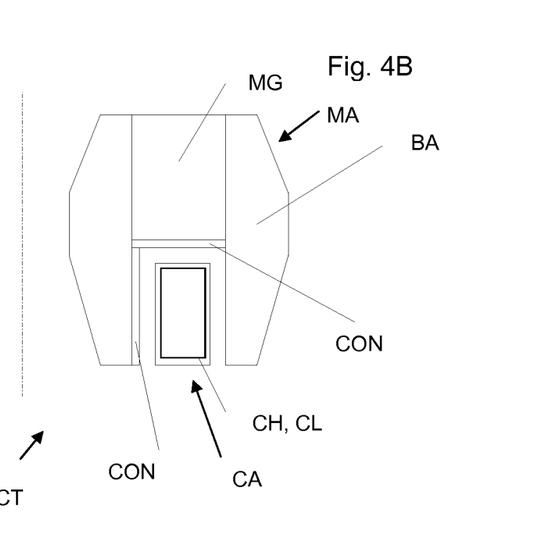

An alternative is depicted in FIG. 4B, where the further electric conductor is provided on the surface of the magnet that faces the coil assembly as well as the surface of the back-iron that faces the coil assembly. Similar effects as explained with reference to FIG. 4A apply to the embodiment as depicted in FIG. 4B also.

As explained above with reference to FIG. 2A, the actuator may be ring shaped. Correspondingly, the further electric conductor as depicted in FIGS. 4A and 4B may be ring shaped. As a result, the further electric conductor will form a closed winding that is able to short circuit the inductive currents, thus providing for a low resistance conductive path for the inductive currents. Hence, a relatively thin layer of the further electric conductor between the coil assembly and the magnet respectively the back-iron may be sufficient to provide a low resistance conductive path. The relatively thin layer of further electric conductor allows a gap between the coil assembly and the magnet assembly to remain small, thus avoiding to sacrifice actuator performance (e.g. motor steepness) to a large extent.

Furthermore, as is the case in the embodiments depicted in FIGS. 4A and 4B, the ring shape of the further electric conductor may be co-axial with the ring shape of the magnet assembly and the ring shape of the coil assembly. Hence, the low resistance conductive path of the ring shape of the further electric conductor may be combined with the ring shape of the coil assembly and magnet assembly to provide a uniform effect by the inductive currents along a circumference of the magnet assembly and the coil assembly.

Figure 4C:
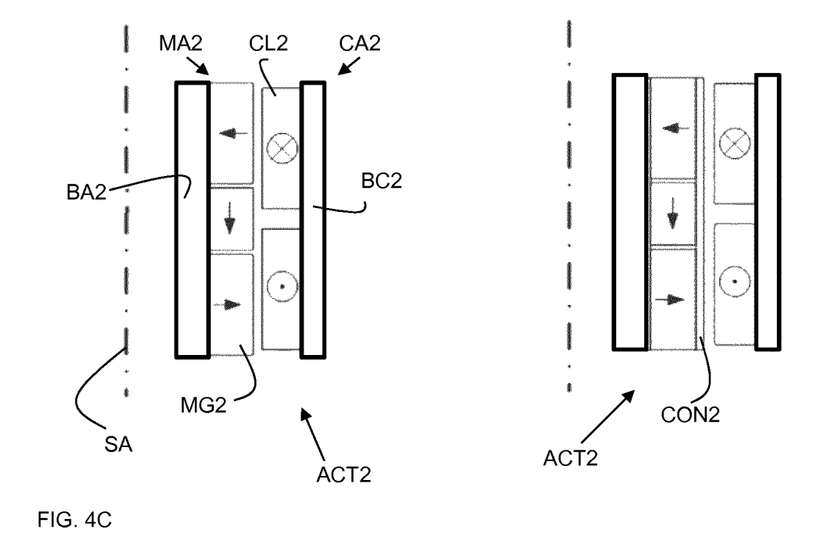
FIG. 4C schematically depicts a part of another actuator as may be employed in a positioning system according to embodiments of the invention FIG. 5 schematically depicts a detailed view of a part of the actuator according to FIG. 4B.

FIG. 4C depicts a cut out view of a part of another actuator ACT2 as may be employed in a positioning system according to an embodiment of the invention. Similar to the actuator ACT as described above, the actuator ACT2 is a rotational symmetrical actuator, symmetrically about the axis SA. The actuator ACT2 comprises a coil assembly CA2 and a magnet assembly MA2. In the embodiment as shown, the magnet assembly MA2 comprises a back-iron BA2 onto which three cylindrical magnets MG2 are mounted, the magnets MG2 having a magnetization direction as indicated by the arrows. The coil assembly CA2 comprises two coils CL2 mounted to a back-iron BC2. As can be seen on the right of FIG. 4C, the actuator ACT2 may also be provided with a further electrical conductor CON2 having the same or similar functionality as the further electrical conductor CON described above.

Figure 5:
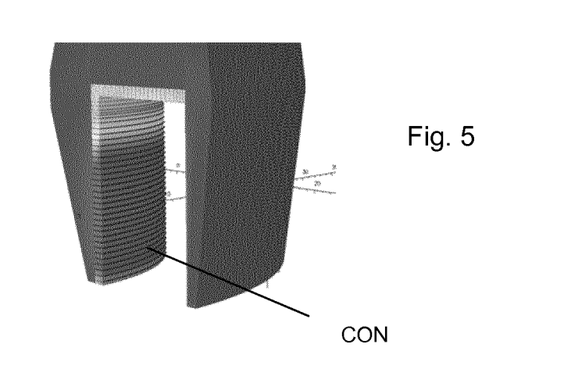

FIG. 5 depicts a detailed view of a part of the magnet and back iron of the actuator in accordance with FIG. 4B. FIG. 5 likewise depicts the further conductor. The inductive currents as induced in the further conductor are schematically indicated by the lines on the further conductor, the lines extending annularly to represent the ring shaped short circuited inductive currents.

The further electric conductor may form a layer on the magnet, the back-iron or both. A thickness of the further electric conductor may be in a range of e.g. micrometers to millimeters.

Figure 6:
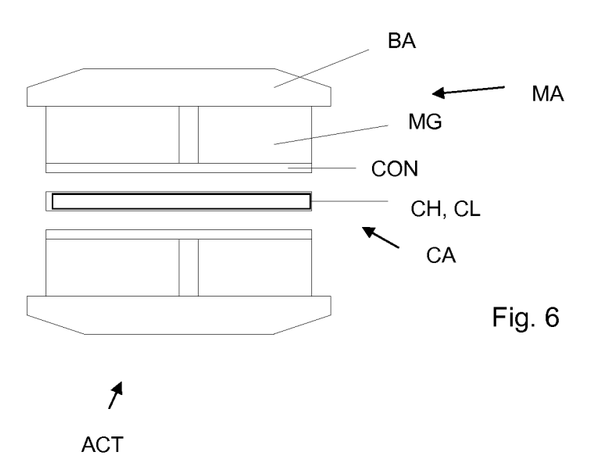
FIG. 6 schematically depicts a view of a part of an actuator as may be employed in a positioning system according to an embodiment of the invention.

Although the above provides an example of ring shaped (rotational symmetric) actuators, it will be understood that the same principle may likewise be applied in a flat actuator. Such a flat actuator may for example comprise a linear motor such as a short stroke motor of a stage, e.g. an actuator which exerts a force in a direction along a plane parallel to a gap between the coil assembly and the magnet assembly. An example is depicted in FIG. 6. The further electric conductor CON may be arranged on the magnet assembly MA, for example the further electric conductor may form a conductive plate, such as a copper plate on the magnet assembly. The actuator may provide for a force and positioning in a direction parallel to the plate (or perpendicular to the plate).

Figure 8A:
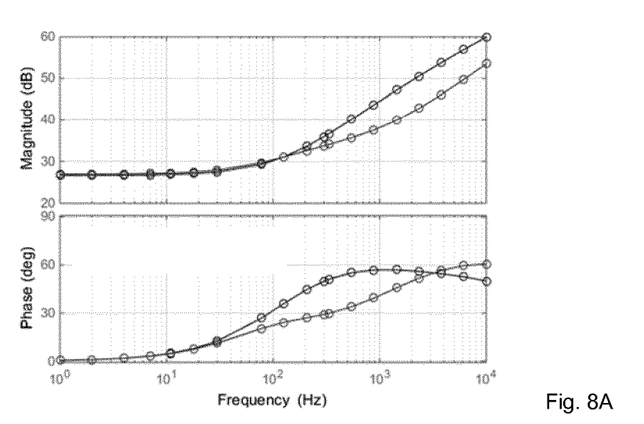
FIGS. 8A and 8B schematically depict bode diagrams of impedance response and motor constant of an actuator as may be employed in a positioning system according to an embodiment of the invention.

An effect of the further conductor in accordance with FIGS. 4A and 4B and likewise FIG. 5, FIG. 6, is described with reference to FIGS. 8A and 8B. FIG. 8A depicts a bode diagram of an impedance response of the actuator in accordance with FIG. 4A resp. 4B. Also, for comparison, the curves of FIG. 7A are copied into FIG. 8A. Comparing a magnitude of the impedance response of the actuator according to FIGS. 4A and 4B with the actuator according to FIG. 2A, an impedance at higher frequencies is lower. As also shown in FIG. 8A, the phase change of the impedance at higher frequencies is less in the embodiment in accordance with FIGS. 4A and 4B as compared to the actuator in accordance with FIG. 2A. Thus, as the inductive currents keep the coil field intact at higher frequencies, the impedance of the actuator is reduced. Hence the control unit and the amplifier may drive the actuator at higher frequencies, thus enabling to increase a bandwidth of the positioning system.

Figure 8B:
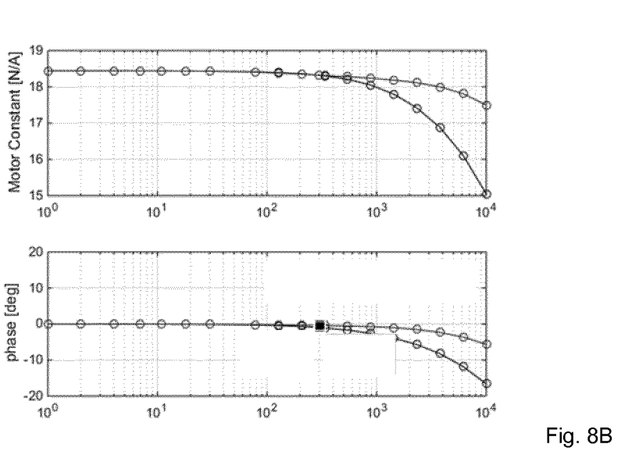

FIG. 8B depicts a bode diagram of a motor constant of the actuator in accordance with FIG. 4A resp. 4B. As explained above, the motor constant is understood as an actuator force as a result of the coil drive current. Again, for comparison, the curves of FIG. 7B are copied into FIG. 8B. As shown in FIG. 8B, the high frequency roll off of the motor constant is less in the embodiments in accordance with FIGS. 4A and 4B as compared to the actuator of FIG. 2A. As also shown in FIG. 8B, the phase of the motor constant follows a corresponding behavior. The further electric conductor provides for less high frequency roll-off in the motor constant, and less high frequency phase change of the motor constant. The coil assembly may further comprise a coil housing in which the coil is arranged. The coil housing may comprise a metal, thereby on the one hand mechanically protecting the windings of the coil and on the other hand guiding heat away from the windings. inductive currents may be generated in the coil housing also. As the field changes in the actuator are dampened by the inductive currents in the further electric conductor, the inductive currents in the coil housing are reduced. Therewith the delay in the motor constant may be reduced. Therefore, a delay of the feedback loop of the positioning system may be reduced, providing a faster response of the positioning system to dynamics in the setpoint.

The positioning system comprising the actuator having the further electric conductor may be applied in a lithographic apparatus, i.e. may form a positioning system in a lithographic apparatus. Accordingly, the positions system according to the invention may be comprised in a stage apparatus for a lithographic apparatus. The actuator having the further electric conductor may for example form a short stroke actuator or vertical actuator of the stage, hence enabling a fast positioning by the enhanced bandwidth capabilities as explained above. For example, the stage may comprise a substrate stage (wafer table) or a mask stage (patterning device). As another example, the actuator comprising the further electric conductor may form an actuator of an optical element of the projection system. The optical element may for example be a mirror of a projection optical box in a reflective projection system for Extreme Ultra Violet radiation, or a lens in a transmissive projection system, hence enabling a fast positioning of the optical element, as may for example be applied when driving the optical element position to e.g. adapt according to a substrate height map.

The invention may further encompass a method of positioning a structure, by a positioning system,
the positioning system comprising an actuator and a control unit to control the actuator in response to a position setpoint received by the control unit, the actuator comprising:

a magnet assembly comprises a magnet configured to provide a magnetic flux, and a coil assembly, wherein the coil assembly and the magnet assembly are movable relative to each other, the coil assembly comprising a coil, an actuation of the coil by a drive current providing for a force between the magnet assembly and the coil assembly, wherein the magnet assembly comprises a further electric conductor, the further electric conductor comprising a non-ferromagnetic electrically conductive material, wherein the further electric conductor is magnetically coupled to the coil of the coil assembly and forms a short circuit path for an inductive electrical current induced in the further electric conductor as a result of an actuator current in the coil, the method comprising:

driving, by means of the control unit, an actuator current into the coil assembly, thereby inducing the inductive current in the further electric conductor, the inductive current being short circuited by the short circuit path.

With the method according to the invention, the same or similar effects may be achieved as with the actuator according to the invention. Also, the same of similar embodiments may be provided as explained with reference to the actuator according to the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A positioning system to position a structure, the positioning system comprising:
    an actuator comprising a magnet assembly having a magnet configured to provide a magnetic flux and a coil assembly having a coil; and
    a control unit coupled to the actuator to control the actuator in response to a position setpoint received at the control unit,
    wherein the magnet and the coil assembly are movable relative to each other, the coil being configured to receive a drive current to induce an actuator current in the coil to cause actuation of the coil and thereby provide a force between the magnet assembly and the coil assembly,
    wherein the magnet assembly also comprises an electric conductor comprising a non-ferromagnetic electrically conductive material, wherein the electric conductor is magnetically coupled to the coil of the coil assembly and forms a short circuit path for an inductive electrical current induced in the electric conductor as a result of the actuator current in the coil, and
    wherein the magnet assembly further comprises a back iron comprising a ferromagnetic material, the back-iron being configured to guide the magnetic flux of the magnet,
    wherein the back-iron extends from the magnet along a side of the coil assembly, the electric conductor being arranged at a face of the back-iron facing the coil assembly.

2. The positioning system of claim 1, wherein an electric conductivity of the electric conductor exceeds an electric conductivity of the magnet.

3. The positioning system of claim 2, wherein the coil comprises windings and the short circuit path formed by the electric conductor is coaxial with the windings of the coil.

4. The positioning system of claim 2, wherein the electric conductor forms a short circuit ring.

5. The positioning system of claim 4, wherein the coil assembly and the magnet assembly each have a ring shaped cross section, the short circuit ring formed by the electric conductor being co-axial with the ring shaped cross sections of the coil assembly and the magnet assembly.

6. The positioning system of claim 5, wherein the electric conductor is arranged at a face of the magnet facing the coil assembly.

7. A lithographic apparatus comprising the positioning system of claim 2, to position a structure of the lithographic apparatus.

8. A projection system for a lithographic apparatus, the projection system comprising one or more optical elements, and the positioning system of claim 2, for positioning one or more of the optical elements.

9. The projection system of claim 8, wherein the projection system is a projection system for an Extreme Ultra Violet (EUV) lithographic apparatus, and wherein the optical elements are mirrors.

10. The positioning system of claim 1, wherein the electric conductor faces the coil assembly.

11. The positioning system of claim 1, wherein the actuator forms a linear actuator, for actuation in a direction along a plane, the magnet assembly and coil assembly facing the plane, the electric conductor forming a planar layer on the magnet assembly extending along the plane.

12. The positioning system of claim 1, wherein the actuator comprises a stator and a mover that is movable in respect of the stator, the stator comprising the magnet assembly and the mover comprising the coil assembly.

13. The positioning system of claim 1, further comprising a position measurement system configured to measure a position of the structure, and an amplifier coupled to the actuator to drive the coil, wherein the control unit comprises a position sensing input, the position as measured by the position measurement system being provided to the position sensing input, and wherein the control unit comprises an output connected to an input of the amplifier, the control unit being configured to drive the amplifier on the basis of the position setpoint and the position as measured by the position measurement system.

14. A stage apparatus for a lithographic apparatus, the stage apparatus comprising an object table and the positioning system of claim 1, for positioning the object table.

15. The stage apparatus of claim 14, wherein the actuator is a voice coil actuator for positioning the object table in a vertical direction.

16. The stage apparatus of claim 14, wherein the actuator is a linear actuator for positioning the object table in a horizontal direction.

17. An electron beam inspection apparatus comprising the positioning system according to claim 1.

18. A method of positioning a structure using the positioning system of claim 1, the positioning system comprising an actuator and a control unit to control the actuator in response to a position setpoint received by the control unit, the method comprising:

driving, using the control unit, an actuator current into the coil assembly, thereby inducing the inductive current in the electric conductor, the inductive current being short circuited by the short circuit path.

* * * * *